United States Patent [19]

Van Der Plas et al.

[11] Patent Number: 5,316,966
[45] Date of Patent: May 31, 1994

[54] METHOD OF PROVIDING MASK ALIGNMENT MARKS

[75] Inventors: Paulus A. Van Der Plas; Herbert Lifka; Robertus D. J. Verhaar, all of Eindhoven, Netherlands

[73] Assignee: U.S. Philips Corporation, New York, N.Y.

[21] Appl. No.: 101,797

[22] Filed: Aug. 3, 1993

Related U.S. Application Data

[63] Continuation of Ser. No. 765,758, Sep. 26, 1991, abandoned.

[30] Foreign Application Priority Data

Sep. 28, 1990 [FR] France .................. 90 11979

[51] Int. Cl.⁵ .......................... H01L 21/302
[52] U.S. Cl. .................... 437/70; 437/924; 437/69; 148/Dig. 102
[58] Field of Search .............. 437/70, 8, 924, 69, 437/72, 73; 148/Dig. 102

[56] References Cited

U.S. PATENT DOCUMENTS

| | | | |
|---|---|---|---|
| 4,233,091 | 11/1980 | Kawabe | 437/68 |
| 4,893,163 | 1/1990 | Rudeck | 357/40 |
| 4,981,529 | 1/1991 | Tsujita | 148/DIG. 102 |
| 5,051,374 | 9/1991 | Kagawa et al. | 148/DIG. 102 |
| 5,106,432 | 4/1992 | Matsumoto et al. | 437/924 |

FOREIGN PATENT DOCUMENTS

| | | | |
|---|---|---|---|
| 0072724 | 4/1984 | Japan | 437/924 |
| 0158519 | 9/1984 | Japan | 148/DIG. 102 |
| 0097639 | 5/1985 | Japan | 148/DIG. 102 |
| 0100928 | 5/1986 | Japan | 437/924 |

*Primary Examiner*—William Powell
*Assistant Examiner*—Tuan Nguyen
*Attorney, Agent, or Firm*—Steven R. Biren

[57] ABSTRACT

A method of manufacturing mask alignment marks on an active surface of a semiconductor substrate (12) is disclosed, in which first, at least one layer (13) of a material resistant to oxidation is formed on the active surface, after which by a local etching of this layer, zones (15') for isolation by a field oxide, are defined simultaneously with the alignment marks (17'). There are formed, after the local etching of the layer (13) of anti-oxidation material while using the remaining parts of the anti-oxidation layer as a mask, depressions (26) at the substrate surface of a given depth at least at locations containing the alignment marks, which locations are designated as alignment windows (18) and the surface of the substrate is then exposed within the windows, and finally a thermal oxidation step is effected to obtain the field oxide (19'), during which the alignment marks (18) are simultaneously covered by oxide (24).

6 Claims, 3 Drawing Sheets

METHOD OF PROVIDING MASK ALIGNMENT MARKS

This is a continuation of application Ser. No. 07/765,758, filed Sep. 26, 1991, now abandoned.

BACKGROUND OF THE INVENTION

The invention relates to a method of providing mask alignment marks on an active surface of a semiconductor substrate, in which first at least one layer of a material resistant to oxidation is formed on said active surface, after which by a local etching of this layer, zones for isolation by a thick oxide, designated as field oxide, are defined simultaneously with the alignment marks, and during a later step the zones for the isolation by field oxide and the said alignment marks thus defined are subjected to a thermal oxidation, the remaining part of the active surface being protected from the oxidation by a remaining part of the layer anti-oxidation material.

A prior art method of this kind is known from the document JP Abstract 61-100928, 157 E 439.

According to the known method, the alignment marks are defined simultaneously with the isolation zones by field oxide. Thus, a relative positioning of these elements is obtained which corresponds to the accuracy of the apparatus used and is therefore free from a possible realignment error at this stage.

In the manufacture of a microcircuit of the type comprising MOS transistors, it is in fact the first operation to define a structure located at the surface of the substrate. The later masking operations necessitate an alignment of the masks as precise as possible by reference to the preformed realignment marks. With the advent of the submicron technologies, it becomes necessary to reduce as far as possible the positioning errors of the masks with respect to the alignment marks defined on the substrate and for this purpose use is made of very elaborate optical methods, which provide an automatic alignment with a tolerance of 0.2 $\mu$m by means of servo-mechanisms of high precision.

However, such mask alignment methods require necessarily that the alignment marks are presented in optimum geometric form and depression depth with a view to their use in an optical method based on the formation of interference figures.

The known method is based on the creation of depressions by an etching of the alignment marks utilizing as a mask, field oxide parts reserved to this end.

This results in that the alignment marks are then composed of depressed parts, in which the substrate is exposed, and other parts, which are covered by field oxide, which leads to difficulties for the formation of the interference figures having a high contrast. On the contrary, it would be desirable to obtain alignment marks protected by an oxide layer preferably having a uniform thickness while maintaining a minimum number of operating steps.

SUMMARY OF THE INVENTION

The invention therefore has for its object to provide a method for providing alignment marks in using a limited number of steps, in which the disadvantage mentioned is avoided and of which the duration of treatments at high temperature is limited to a minimum required to form the field oxide.

These objects are achieved according to the invention by a method of providing mask alignment marks according to the opening paragraph, which is characterized in that, after the local etching of the layer of anti-oxidation material and while using the remaining parts of the anti-oxidation layer as a mask, depressions are formed of a given depth at the substrate surface, at least at locations containing the alignment marks, which locations are designated as alignment windows; in that the surface of the substrate is then exposed within the said windows, and in that finally a thermal oxidation step is effected to obtain the field oxide, during which the alignment marks are simultaneously covered by oxide.

This method offers the advantage of producing alignment marks protected by a layer of oxide of uniform thickness. Furthermore, the remaining parts of the anti-oxidation layer are preserved (outside the alignment windows) and they can be maintained when this proves to be useful during the further processing of the devices. The precision of positioning of the alignment marks with respect to the field oxide zones is optimal because it results from openings provided simultaneously in the anti-oxidation layer.

According to a first embodiment of the invention, the method is characterized in that the said depressions are formed by a specific thermal oxidation step in conditions such that it leads to a conversion into oxide of the semiconductor over a depth equal to the said given depth, and in that, after having exposed the surface of the semiconductor within the said alignment windows, the oxidation step already mentioned for forming the field oxide is effected, which is complementary to the specific oxidation step.

In this embodiment, the depressions formed at the surface of the semiconductor have a depth which can be controlled with a very high precision, typically $\pm 10$ nm. The said specific thermal oxidation treatment then constitutes a first step of forming the field oxide, which provides only a fraction of the final desired thickness. After the surface of the semiconductor has been exposed in the said alignment windows, the thermal oxidation step mentioned above then constitutes a complementary oxidation step resulting in a field oxide having a thickness desired at this stage of the manufacturing process, while the alignment marks are covered by an oxide layer having a smaller homogeneous thickness.

A second embodiment of the method according to the invention is characterized in that the said depressions are formed by selective etching solely in the alignment windows which are defined by means of a mask of photosensitive resin, and in that then the remaining parts of the anti-oxidation layer are withdrawn in the said windows and with the same mask, after which the mask of photosensitive resin is withdrawn and a single thermal oxidation step is effected to form the field oxide.

According to this embodiment of the method, the selective etching producing the depressions is obtained by an attack in a plasma or in a selective etching solution, preferably at a low etching rate, to obtain the desired precision of the depth of the depressions. The mask of photosensitive resin does not require a rigorous precision of positioning because it suffices that the said alignment windows enclose the alignment marks. The oxidation treatment is then effected in a single step and leads to a thickness of the oxide layer which is the same both on the isolation zones (field oxide) and on the alignment marks.

As a variation of this embodiment of the method, it is also possible to form the depressions in the isolation zones. This method is characterized in that the said depressions are formed by selective etching while using solely the anti-oxidation layer as a selective mask, in that then the remaining parts of the anti-oxidation layer are withdrawn solely in the alignment windows then defined by means of a mask of photosensitive resin, after which the mask of photosensitive resin is withdrawn and a single thermal oxidation step is effected to form the field oxide.

BRIEF DESCRIPTION OF THE DRAWING

In this case, the field oxide is then depressed into the substrate over a depth corresponding to the depressions, which can offer an advantage for the process of manufacturing the device.

Advantageously, the depth of the depressions is close to ¼ of the wavelength of the light utilized to exploit the alignment marks; in general, it lies between 100 and 150 nm and is preferably equal to 125 nm±10 nm. Thus, the optical contrast obtained during the further operations of mask alignment is optimal.

Figure 1:
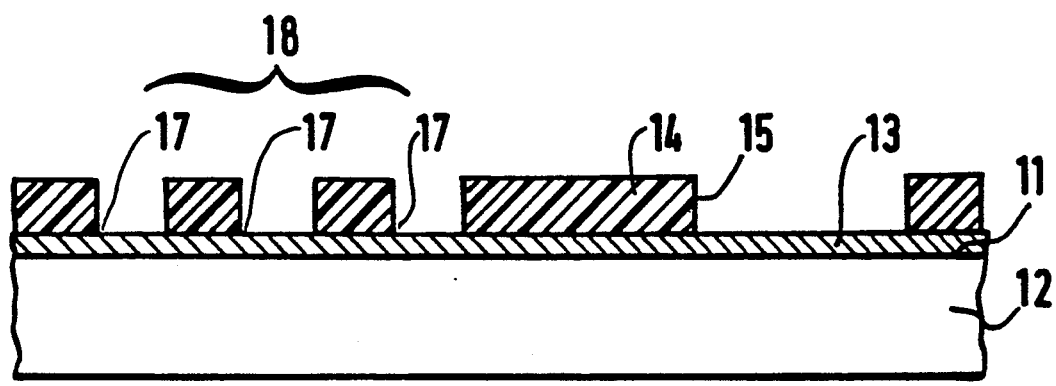

The invention will be understood more clearly by means of the following description with reference to the accompanying drawing and relating to non-limitative examples.

Figure 6:
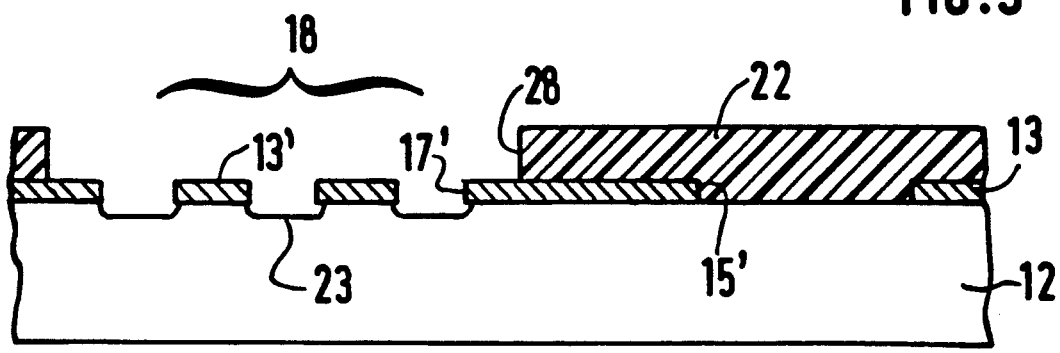
Figure 7:
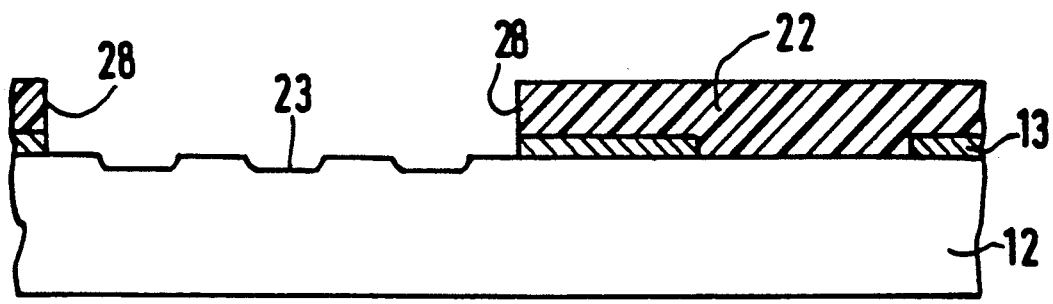
Figure 8:
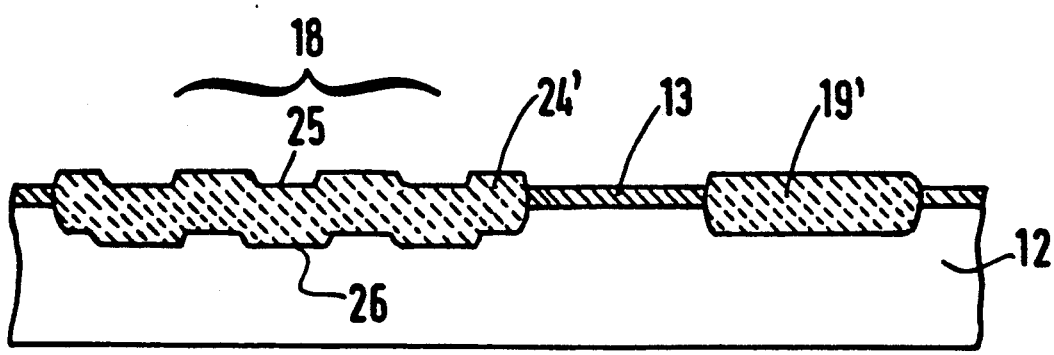
Figure 9:
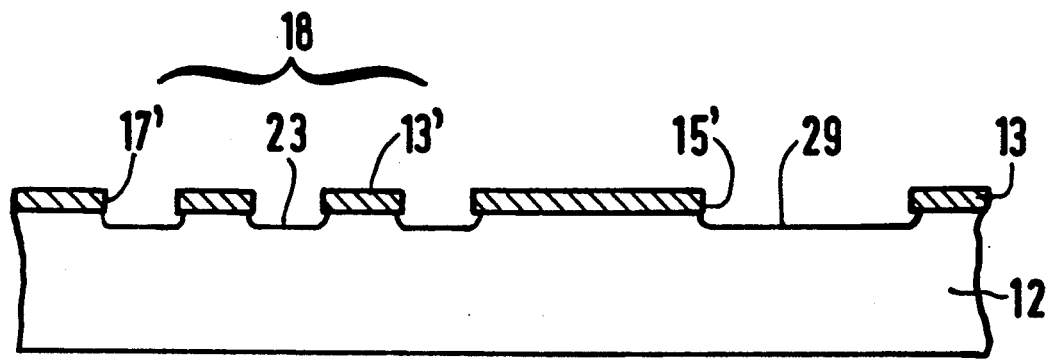
Figure 10:
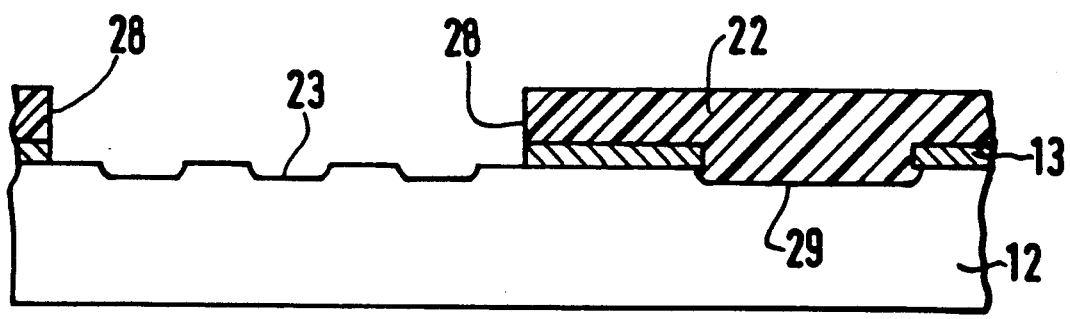
Figure 11:
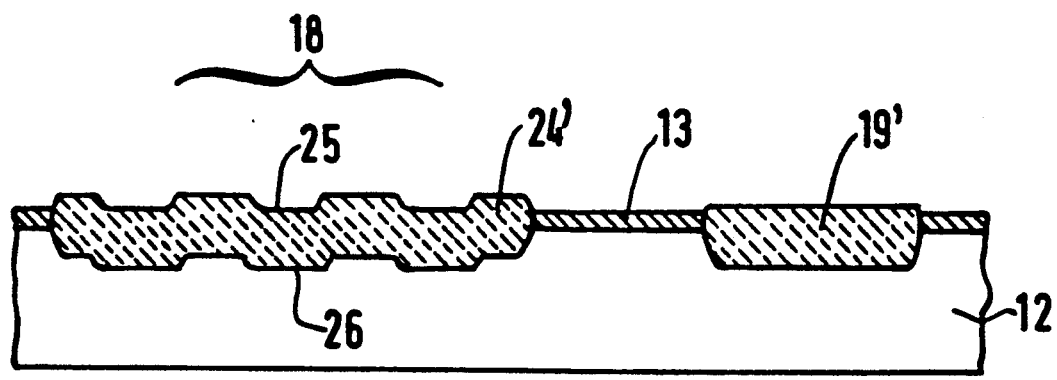

In the drawings:

FIGS. 1 to 5 show in diagrammatic sectional view different steps during the method of manufacturing mask alignment marks in a first embodiment of the invention;

FIGS. 6 to 8 show analogous elevations relative to a second embodiment of the method; and FIGS. 9 to 11 relate to a third embodiment of the invention.

It should be noted that in the Figures the proportions between the different parts are not taken into account for the sake of clarity and especially the thicknesses have been greatly exaggerated. In the different Figures, the elements corresponding to each other as to their functions are provided with the same reference symbols.

DESCRIPTION OF THE PREFERRED EMBODIMENTS

With reference to FIG. 1, a layer 13 of a material resistant to oxidation has been formed on an active surface 11 of a semiconductor substrate 12, particularly of monocrystalline silicon. The layer 13 shown in the Figures as a homogeneous layer is mostly formed by a succession of a thin layer of oxide, on which a layer of silicon nitride is disposed, or formed by a layer of silicon oxynitride or by successive layers of these materials. The whole is coated with a mask 14 of photosensitive resin having on the one hand openings 15 corresponding to the location of field oxide isolation zones and on the other hand a plurality of openings 17, the group of which constitutes a mask alignment mark 18.

The parts of the layer 13 of anti-oxidation material situated in the openings 15 and 17 are withdrawn by etching, preferably in a plasma comprising fluorine ions or chlorine ions in conditions which ensure a selective etching with respect to the substrate or with respect to a sublayer of oxide, as the case may be. The anti-oxidation layer may also be etched selectively in a bath of hot phosphoric acid. When the layer 13 of anti-oxidation material comprises a thin sublayer of silicon oxide, this sublayer may be or may not be withdrawn in the openings 15 and 17, which does not entail any important consequence for the following steps of the method.

Figure 2:
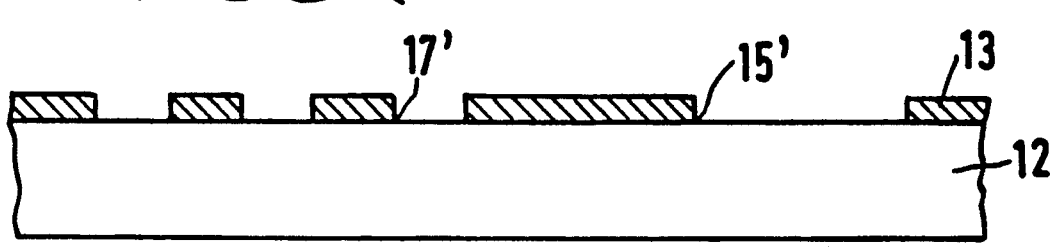
Figure 3:
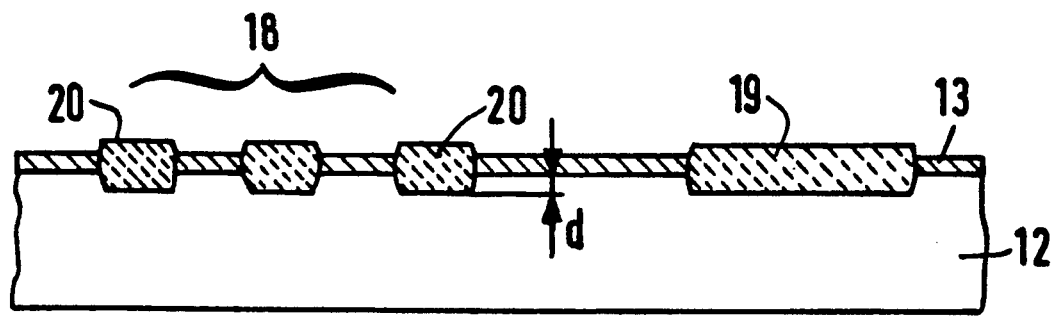

As indicated in FIG. 2, the mask 14 of photosensitive resin is then withdrawn and the openings 17' and 15' subsist in the layer 13. The semiconductor substrate is subjected to a thermal oxidation treatment in a furnace at about 1000° C. for 40 mn in an atmosphere constituted by a mixture of water vapor and oxygen. A local oxide layer is formed, on the one hand a layer part 19 corresponding to the location of the field oxide isolation zones, and on the other hand further local elements 20 of oxide at the location of the alignment marks 18. The local elements 19 and 20 of oxide have a thickness of about 280 nm, while the depression d created by the conversion of the semiconductor into oxide is about equal to 125 nm. The result obtained at this stage of the method is shown in FIG. 3.

The thermal oxidation treatment just indicated is analogous to that which is generally used to form a field oxide, but in the present case a specific step is concerned which is intended to define the alignment marks 18, but which at the same time provides a fraction of the final thickness desired for the field oxide.

Figure 4:
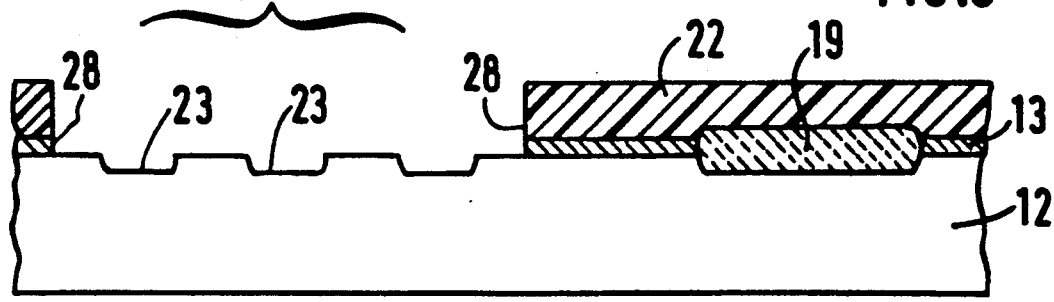

Reference is now made to FIG. 4 for the following steps of the method. The preceding assembly is coated with another mask 22 of photosensitive resin provided with windows 28 designated as "alignment windows", which enclose the positions of the alignment marks 18, while the remainder of the surface is protected by this mask 22. Subsequently, the surface of the semiconductor in the said windows 28 is exposed by selective etching with respect to the silicon, for example by means of a bath of hot phosphoric acid, followed by a bath of buffered hydrofluoric acid or by an etching step in plasma of fluorine ions or chlorine ions.

It should be noted that the positioning of the alignment windows 28 is not necessarily very rigorous because the very depressions 23 left by the consumption of semiconductor material having served to form the local elements 20 of silicon oxide constitute the precise track of the alignment marks under construction.

Figure 5:
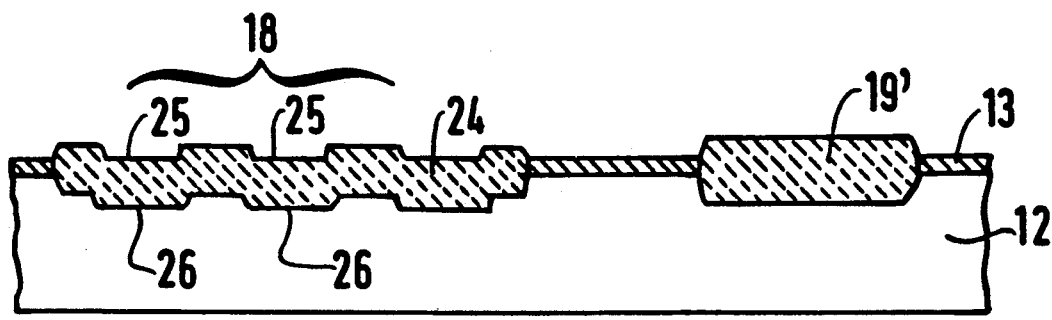

FIG. 5 shows the result obtained during the following operations resulting in the simultaneous formation of the field oxide and of the mask alignment marks. These operations consist in withdrawing the mask 22 and in subjecting the semiconductor substrate to a second thermal oxidation step at 1000° C. for 75 mn in wet oxygen such as for obtaining field oxide zones 19' having a thickness of 500 nm, as is desired for the following steps of the method of manufacturing the integrated semiconductor device, while the alignment marks 18 are surface oxidized at the surface by the same treatment and thus coated with an oxide layer 24 having a thickness close to about 410 nm.

It should be noted that the alignment marks 18 are constituted on the one hand at the surface of the oxide layer 24 by depressions 25, whose shape is directly derived from the depressions 23 formed beforehand in the semiconductor material, and on the other hand by depressions 26 situated at the interface between the semiconductor 12 and the local oxide layer 24, which have been formed by oxidation and are obtained by translation with respect to the depressions 25. During this translation, a slight widening of the geometry of the depressions 26 is obtained, which is distributed symmetrically with respect to the centers of the depressions due to the fact that the oxidation phenomenon can be considered as perfectly isotropic at this dimension scale. Whether the upper surface of the oxide layer 24 (if it is later metallized) or the surface of the semiconductor is utilized optically for an alignment operation, in all cases the axis of symmetry of each alignment mark is perfectly maintained and the further mask alignment operations can be very precise with reference to the pitch and to the average position of the assembly of the elements of the marks.

FIGS. 6 to 8 will now serve to describe a second embodiment of the method according to the invention. In this embodiment, the steps which have been described with reference to FIGS. 1 and 2 are identical.

After having opened the windows 17' and 15' in the anti-oxidation layer 13 and as indicated in FIG. 6, the whole is covered by a mask 22 identical in shape and kind to the mask 22 described with reference to FIG. 4. Therefore, it has alignment windows 28 which comprise the alignment marks 18. In the alignment windows 28, depressions 23 are then provided directly in the semiconductor 12 while using remaining parts 13' of the layer 13 of anti-oxidation material present in the said window, which depressions are provided over a depth of about 130 nm. The depressions 23 are obtained by selective etching with respect to the mask 22 of photosensitive resin and with respect to the layer 13' of anti-oxidation material. A mixture of nitric acid, hydrofluoric acid and acetic acid can be used for this purpose. An anisotropic etching by plasma may also be used and the selectivity obtained, for example, by means of a sublayer of oxide situated under the anti-oxidation layer 13.

As indicated in FIG. 7, the mask 22 is maintained and in the alignment windows 28 the remaining parts 13' of the anti-oxidation layer are withdrawn and the surface of the semiconductor substrate 12 is exposed therein.

Subsequently, the second mask 28 is withdrawn and the assembly is subjected to a thermal oxidation treatment, which in a single step provides the oxide thickness desired for the field oxide isolation.

FIG. 8 indicates the result obtained after this process step. This result is very comparable with that obtained in the preceding embodiment and described in FIG. 4. However, the local oxide layer 24', which is homologous to the layer 24 of FIG. 5, has here the same thickness as the field oxide 19' because these layers are formed during the same oxidation step. The alignment marks 18 obtained here again have an upper oxide surface which comprises depressions 25 corresponding to the depressions 23 formed in the preceding step at the surface of the semiconductor substrate and depressions 26 at the semiconductor/oxide interface and which have geometric and optical properties corresponding to the precise alignment function of the further masking operations.

A variation of the embodiment of the method just described is illustrated in FIGS. 9 to 11. According to this variation, depressions 23 corresponding to the alignment marks 18 and depressions 29 corresponding to the field oxide isolation zones are formed by selective etching while utilizing only the anti-oxidation layer 13 provided with the windows 17' and 15' as a selective mask (see FIG. 9). The mask 22 of photosensitive resin provided with the alignment windows 28 is only thereafter provided (FIG. 10) so as to withdraw the remaining parts 13' of the anti-oxidation layer only in the said windows 28.

Subsequently, the mask 22 is withdrawn and in a single step the thermal oxidation is carried out to form the field oxide 19' in the corresponding zones. During this step (FIG. 11), the alignment marks 18 are also oxidized by a layer 24' having the same thickness as the field oxide and comprising, as in FIG. 8, depressions 25 and 26, respectively, at the upper surface of the oxide layer 24' and at the interface between this layer and the semiconductor substrate 12.

The only difference in result with respect to the method described with reference to FIG. 8 is that here the field oxide zones 19' are slightly depressed into the substrate over a depth corresponding to the depressions 29 provided beforehand by oxidation.

We claim:

1. A method of providing mask alignment marks on an active surface of a semiconductor substrate, in which first at least one layer of a material resistant to oxidation is formed on this active surface, after which by a local etching of this layer, zones for isolation by a thick oxide, designated as a field oxide, are defined simultaneously with the alignment marks, and during a later step the zones for the isolation by field oxide and said alignment marks thus defined are subjected to a thermal oxidation, the remainder of the active surface being protected from oxidation by a remaining part of the layer of anti-oxidation material, wherein, after the local etching of the layer of anti-oxidation material and while utilizing the remaining parts of the anti-oxidation layer as a selective mask, substantially flat-bottomed depressions are formed at the surface of the substrate having a given depth at least at locations which contain the alignment marks, which locations are designated as alignment windows, the surface of the substrate is then exposed within said windows, and finally a thermal oxidation step is effected for forming the field oxide, during which the alignment marks are simultaneously covered by an oxide layer of uniform thickness.

2. A method as claimed in claim 1, characterized in that said depressions are formed by a specific thermal oxidation step such that this step leads to a conversion of the semiconductor into oxide over a depth equal to the said given depth and that, after having exposed the surface of the semiconductor within the said alignment windows, the oxidation step already mentioned for the formation of the field oxide is effected, which is complementary to the specific oxidation step.

3. A method as claimed in claim 1, characterized in that said depressions are formed by selective etching only in the alignment windows, which are defined by means of a mask of photosensitive resin, and in that then the remaining parts of the anti-oxidation layer are withdrawn in said windows and with the same mask, after which the mask of photosensitive resin is withdrawn and a single thermal oxidation step is effected for forming the field oxide.

4. A method as claimed in claim 1, characterized in that the said depressions are formed by selective etching while utilizing only the anti-oxidation layer as a selective mask, in that then the remaining parts of the anti-oxidation layer are withdrawn in the alignment windows, which are then defined by means of a mask of photosensitive resin, after which the mask of photosensitive resin is withdrawn and a single thermal oxidation step is effected for forming the field oxide.

5. A method as claimed in claim 1, characterized in that said given depth of the depressions is about ¼ of the wavelength of the light utilized to exploit the alignment marks.

6. A method as claimed in claim 5, characterized in that said depth of the depressions lies between 100 and 150 nm.

* * * * *